US007352252B2

(12) United States Patent
Gonzalez et al.

(10) Patent No.: US 7,352,252 B2
(45) Date of Patent: Apr. 1, 2008

(54) CIRCUIT AND METHOD TO MEASURE THRESHOLD VOLTAGE DISTRIBUTIONS IN SRAM DEVICES

(75) Inventors: Christopher J. Gonzalez, Shelburne, VT (US); Vinod Ramadurai, Burlington, VT (US); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 11/456,684

(22) Filed: Jul. 11, 2006

(65) Prior Publication Data

US 2008/0024232 A1  Jan. 31, 2008

(51) Int. Cl.
G01R 23/00 (2006.01)
H03B 5/24 (2006.01)
G11C 99/00 (2006.01)

(52) U.S. Cl. .............................. 331/44; 331/49; 331/57; 365/244

(58) Field of Classification Search ................. 331/44, 331/46, 49, 57, 74, 75, 173; 365/244
See application file for complete search history.

(56) References Cited

U.S. PATENT DOCUMENTS

| 4,142,114 A | 2/1979 | Green ........................ 307/304 |
| 4,739,191 A | 4/1988 | Puar ........................... 307/297 |
| 5,485,126 A | 1/1996 | Gersbach et al. ............. 331/57 |
| 5,892,409 A | 4/1999 | Boerstler ..................... 331/57 |
| 5,903,012 A | 5/1999 | Boerstler ..................... 257/48 |
| 6,133,799 A | 10/2000 | Favors, Jr. et al. ........... 331/57 |
| 6,313,511 B1 | 11/2001 | Noguchi ..................... 257/392 |
| 6,795,800 B1 | 9/2004 | Lee ............................... 703/2 |
| 6,947,515 B2 | 9/2005 | Neary ........................ 375/376 |
| 7,180,380 B2 * | 2/2007 | Bienek et al. ................ 331/66 |

FOREIGN PATENT DOCUMENTS

JP  2004-228329  8/2004

OTHER PUBLICATIONS

"Evaluating high leakage effects of low V/sub TH/circuits using high V/sub TH/devices," Miyazaki, T.; Sakurai, T.; Microelectronic Test Structures, 2004. Proceedings. ICMTS '04. The International Conference on Mar. 22-25, 2004; pp. 241-244.

(Continued)

Primary Examiner—David Mis
(74) Attorney, Agent, or Firm—Downs Rachlin Martin PLLC

(57) ABSTRACT

A circuit for inline testing of memory devices which provides information on the variation of the threshold voltage. The circuit includes an array of ring oscillators with a series of inverters, which already exist in the memory device. A control logic systematically steps through all of the ring oscillators by enabling each inverter and toggling the input. The mean frequency and its distribution is measured and recorded in an output circuit. The threshold voltage variation in the memory device is deduced from the ring oscillators. The circuit additionally includes two inverters place external of the memory device. Each ring oscillator is coupled to an inverter. The inverter preconditions the elements of the ring oscillator to prevent a resistive divider between the two transistors.

19 Claims, 2 Drawing Sheets

Schematic of VT Sensitive Ring Oscillator

OTHER PUBLICATIONS

"A statistical model based ASIC skew selection method," Wang, D.T.; Mcnall, W.; Microelectronics and Electron Devices, 2004 IEEE Workshop on 2004; pp. 64-66.

"Characteristics of GaAs DCFL MESFET's and inverters exposed to high-energy neutrons," Bloss, W.L.; Yamada, W.E.; Rosenbluth, M.L.; Janousek, B.K.; Nuclear Science, IEEE Transactions on vol. 36, Issue 6, Part 1-2, Dec. 1989; pp. 2443-2449.

\* cited by examiner

CIRCUIT AND METHOD TO MEASURE THRESHOLD VOLTAGE DISTRIBUTIONS IN SRAM DEVICES

FIELD OF THE DISCLOSURE

The present disclosure generally relates to the field of semiconductor memory circuits. In particular, the present disclosure is directed to a circuit and method to measure threshold voltage distributions in SRAM devices.

BACKGROUND OF THE DISCLOSURE

As complementary metal-oxide semiconductor (CMOS) static random access memory (SRAM) circuits continue to shrink in accordance with Moore's Law, the inherent variability in the transistors is increasingly influencing the performance and functionality of the SRAM circuits. Thus, obtaining a clear understanding of how much variance these devices possess is valuable to SRAM designers, transistor model designers, and the process engineering groups.

Conventional methods exist to obtain transistor variation information, including probing the transistors in a laboratory. However, this process is very time consuming and expensive and therefore is not widely implemented.

SUMMARY OF THE DISCLOSURE

In one aspect, a circuit to measure characteristics of a memory device having a plurality of inverters with transistors of a first transistor type is provided. The circuit including an array of ring oscillators, wherein each of the ring oscillators in the array (a) produces a ring oscillator output signal such that the array produces a plurality of ring oscillator output signals and (b) includes a plurality of inverters having transistors of the first transistor type; a multiplexer connected to the array of ring oscillators to receive the plurality of ring oscillator output signals and to provide as an output, in response to a select signal, one of the plurality of ring oscillator output signals; a control logic unit coupled to the array of ring oscillators and to the multiplexer, the control logic unit enabling each of the ring oscillators in the array so as to cause the array produce the plurality of ring oscillator output signals, further wherein the control logic unit provides the select signal; and an output circuit receiving the plurality of ring oscillator output signals from the multiplexer; wherein the output circuit measures output frequency variability in each of the plurality of ring oscillator output signals.

In another aspect, a memory device is provided. The memory device includes an array of ring oscillators received in the memory device, wherein each of the array of ring oscillators includes a plurality of inverters formed from existing same-type devices of the memory device.

In a further aspect, a method of measuring threshold voltage distribution in a memory device is provided. The method comprises the step of providing an array of ring oscillators in the memory device. Each ring oscillator includes a plurality of ring inverters coupled in series. The plurality of ring inverters includes existing same type devices of the memory device.

BRIEF DESCRIPTION OF THE DRAWINGS

For the purpose of illustrating the disclosure, the drawings show aspects of one or more embodiments of the disclosure. However, it should be understood that the present disclosure is not limited to the precise arrangements and instrumentalities shown in the drawings, wherein.

DETAILED DESCRIPTION

Figure 1:
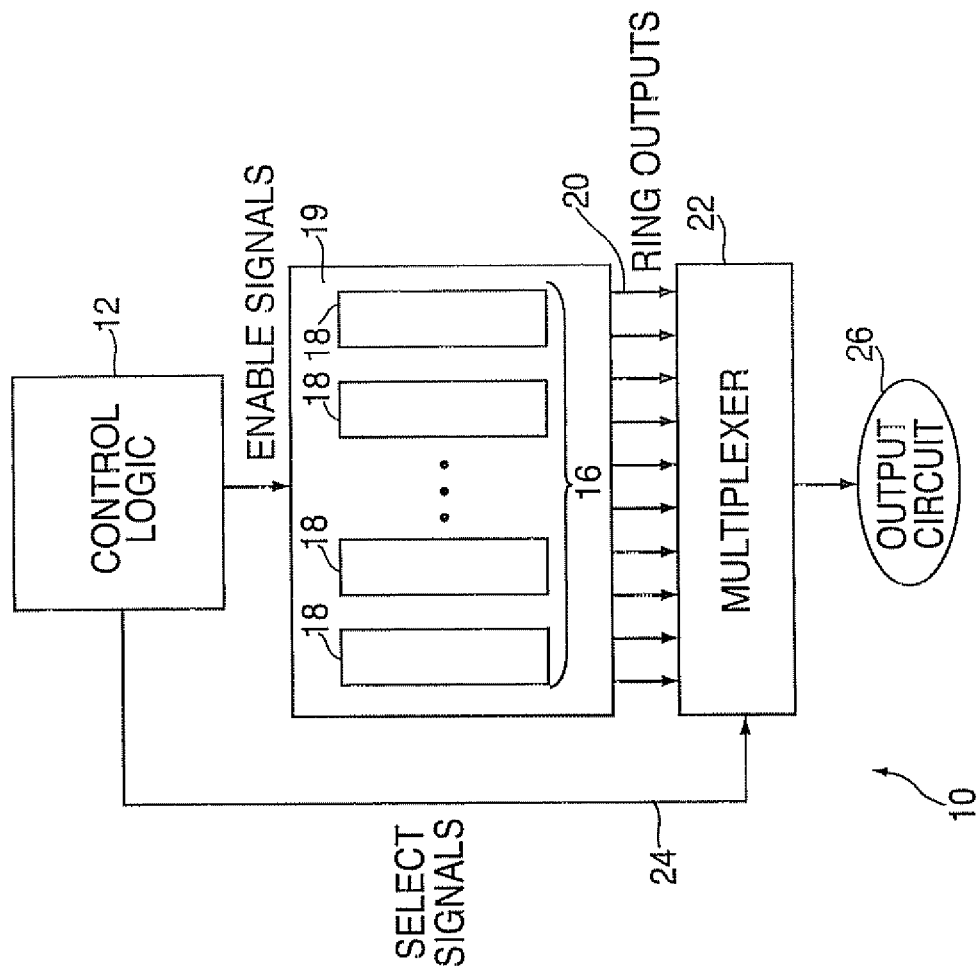
FIG. 1 is a block diagram of one embodiment of a circuit for measuring threshold voltage distributions in a SRAM device.

FIG. 1 illustrates a block diagram of a circuit 10 for inline testing of SRAM chips to obtain threshold voltage variation information, in accordance with an embodiment of the present disclosure. Circuit 10 includes a control logic 12 that sends enabling signals 14 to an array 16 of ring oscillators 18 provided on a SRAM device 19. Array 16 provides a plurality of ring outputs 20 to multiplexer 22. Control logic 12 sends enable signal 14 to enable either individual or multiple ring oscillators 18 in SRAM 19. Control logic 12 sends a select signal 24 to multiplexer 22 to control which output 20 of ring oscillators 18 is sent to output circuit 26.

Control logic 12 systematically steps through all of ring oscillators 18, in desired, e.g., random or sequential order, by enabling each ring oscillator and toggling the input to change from a high state to a low state, and vice versa. The output frequency of multiplexer 22 is modulated as individual ring oscillators 18, characterized by different values of $V_t$, are selected. The mean output frequency of the multiplexer 22 and its distribution are measured by a commercial frequency measurement device and recorded in output circuit 26. Output circuit 26 maps the variations in threshold voltage, $V_t$, to the variations in frequency of each ring oscillators 18 of array 16. Ring oscillators 18 each have inherent differences in frequency, and so the frequency of output circuit 26 will depend on which ring oscillator is selected. The variation in threshold voltage of transistors (described more below) in ring oscillators 18 is the strongest contributor to the variation in the measured frequencies of the ring oscillators stored in output circuit 26. A threshold voltage variation can be determined from the measured frequencies stored in output circuit 26 using conventional techniques to those skilled in the art. Each device of each ring oscillator 18 has a specific and particular frequency which can be utilized to determine the physical location of each device within each ring oscillator.

Figure 2:
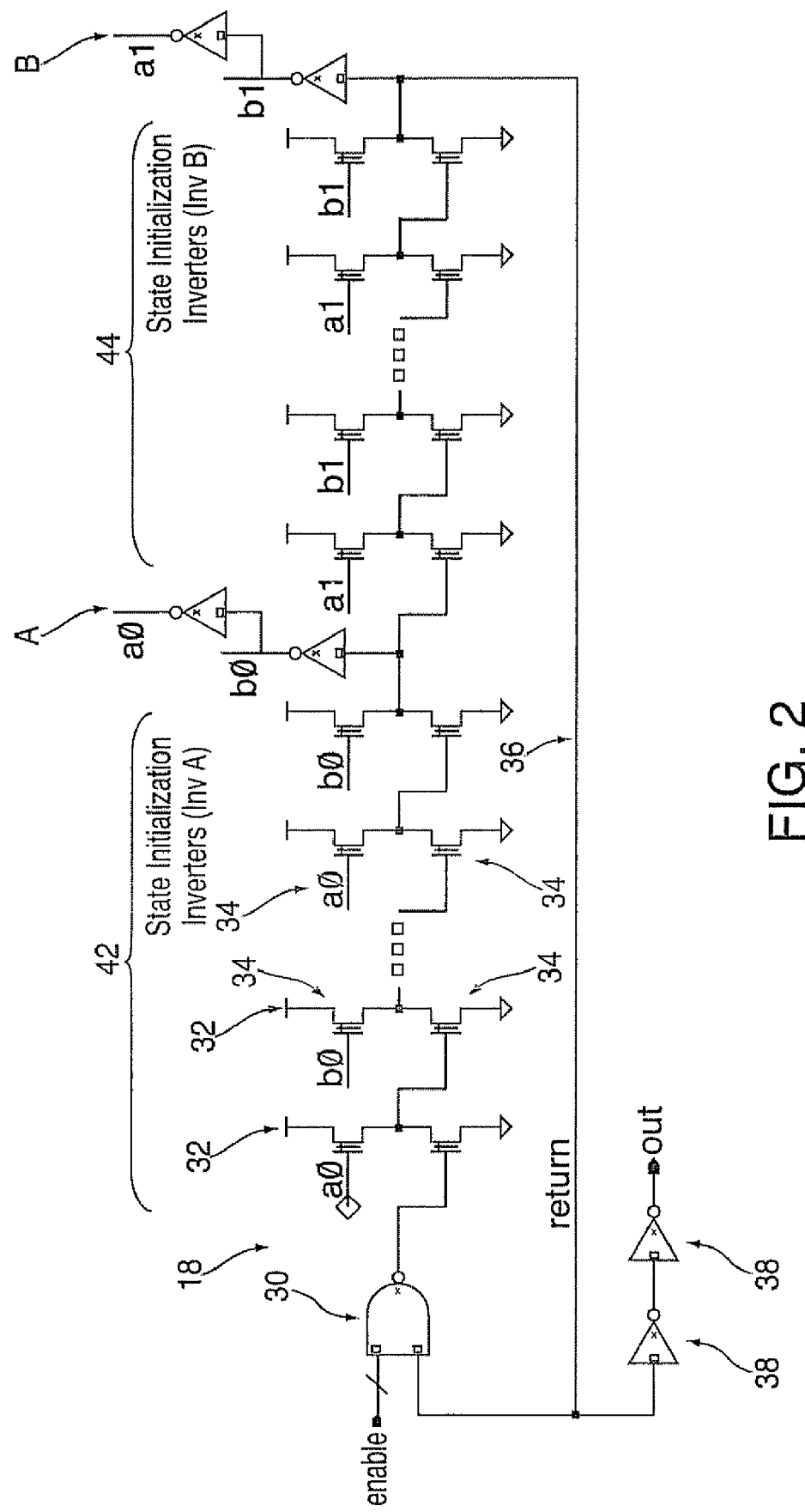
FIG. 2 is a schematic diagram of an embodiment of a threshold voltage sensitive ring oscillator circuit.

Referring now to FIG. 2, a schematic diagram of a ring oscillator 18 sensitive to threshold voltage of SRAM is illustrated, according to one embodiment of the present disclosure. Each ring oscillator 18 includes a NAND logic gate 30 connected in series with a plurality of inverters 32, each having transistors 34 of the same transistor type, e.g. NFET devices, to form a loop with a return line 36. The latter includes output inverters 38 to condition the output signal from ring oscillators 18. In this aspect of the disclosure, the use of same-type transistors 34 in ring oscillator 18 helps eliminate or greatly reduces the variability when measuring a distribution of output delays of output circuit 26. For example, in ring oscillators with two device types, the variation in distribution of output delays is caused by both device types. Whereas, in this aspect, when the distribution of the output delays are measured, the distribution is only caused by variation of one type of device. Ring oscillator 18 further includes feedback inverters A and B placed within the series of inverters.

Transistors 34 are existing devices of SRAM 16, thereby allowing ring oscillators 18 to be formed in the native environment of the SRAM device 19. Since the architecture or footprint of SRAM device 19 is undisturbed in the native environment, adjustment or fine-tuning of the SRAM device may not be required. The layouts of ring oscillators 18 and the surrounding environment are identical, which limits the amount of ring-to-ring variation due to systematic events. Since ring oscillators 18 generally contain only NFETs (or alternatively only PFETs) for all but one stage in the loop, the frequency variation of the output of the ring oscillators in only dependent on NFET or PFET threshold voltage to the first order. Moreover, in determining the frequency of the output ring of SRAM devices 19, all of the specific processing effects unique to SRAM devices can be considered. It should be noted that while the present disclosure illustrates the use of NFETs and NMOS, the use of PFETs and PMOS is also within the scope and spirit of the present disclosure.

In conventional NMOS logic, the pull-up devices are sized considerably smaller than the pull-down devices. The size variation between conventional pull-up and pull-down devices is generally needed to guarantee functionality for more than a few stages in a conventional NMOS logic circuit. In one example, transistors 34 of SRAM 16, which are of the same type devices and typically matched, may not be able to guarantee functionality for more than a few stages. Accordingly, transistors 34 of SRAM 16 may add a feedback inverter to precondition inverters 32 of the SRAM device.

In the illustrative embodiment of FIG. 2, inverters 32 are divided into a first group 42 and a second group 44. The output of first group 42 and the input of second group 44 are coupled to a feedback inverter A and the output of second group 44 is coupled to feedback inverter B. It should be noted that inverters 32 can be divided into more than two groups, dependent on the application and performance requirements, while keeping within the scope and spirit of the present disclosure. Feedback inverters A preconditions first group 42 and feedback inverter B preconditions second group 44, such that there is no resistive divider between transistors 34 of each group. Feedback inverters A and B are selected to provide adequate time for the preconditioning to occur before inverters 32 toggle from zero to one, and vice versa. For example, in a DC state, where enable signal is set to zero, both sets of feedback inverters A and B are set to a starting condition. Once an enable signal provided to NAND logic gate is set to 1, inverters 32 of ring oscillator 18 begin to toggle. Once a ring signal reaches feedback inverter A, the latter begins to condition first group of inverters 42 while the toggling ring signal continues towards second group of inverters 44 and feedback inverters B.

Figure 3:
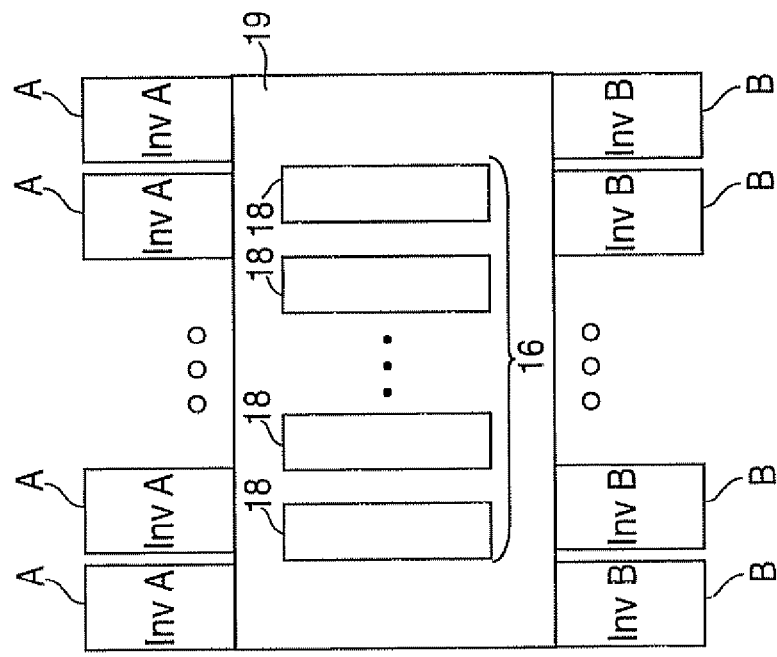
FIG. 3 is a schematic diagram of one suitable placement of feedback inverters on a SRAM device.

The present disclosure contemplates implementing feedback inverters A and B without breaking up the continuity of SRAM device 19. Thus, feedback inverters A and B are placed outside of SRAM device 19, as best illustrated in FIG. 3, to maintain ring oscillators 18 in their native environment which is densely packed within the SRAM device.

Exemplary embodiments have been disclosed above and illustrated in the accompanying drawings. It will be understood by those skilled in the art that various changes, omissions and additions may be made to that which is specifically disclosed herein without departing from the spirit and scope of the present disclosure.

What is claimed is:

1. A circuit to measure characteristics of a memory device having a plurality of inverters with transistors of a first transistor type, the circuit comprising:
   an array of ring oscillators, wherein each of said ring oscillators in said array (a) produces a ring oscillator output signal such that said array produces a plurality of ring oscillator output signals and (b) includes a plurality of inverters having transistors of said first transistor type;
   a multiplexer connected to said array of ring oscillators to receive said plurality of ring oscillator output signals and to provide as an output, in response to a select signal, one of said plurality of ring oscillator output signals;
   a control logic unit coupled to said array of ring oscillators and to said multiplexer, said control logic unit enabling each of said ring oscillators in said array so as to cause said array produce said plurality of ring oscillator output signals, further wherein said control logic unit provides said select signal; and
   an output circuit receiving said plurality of ring oscillator output signals from said multiplexer;
   wherein said output circuit measures output frequency variability in each of said plurality of ring oscillator output signals.

2. A circuit of claim 1, wherein said memory device comprising a static random access memory device sizes and environment.

3. A circuit of claim 1, wherein said ring inverters comprising n-channel field effect transistors.

4. A circuit of claim 1, wherein said ring inverters comprising p-channel field effect transistors.

5. A circuit of claim 1, further comprising at least two feedback inverters;
   wherein said ring inverters divided into at least two groups, at least one feedback inverter coupled to associated said group of ring inverters.

6. A circuit of claim 5, further wherein said groups include an equal number of inverters.

7. A circuit of claim 5, further wherein said at least two feedback inverters are located external of the memory device.

8. A memory device comprising an array of ring oscillators received in the memory device;
   wherein each of said array of ring oscillators includes a plurality of inverters formed from existing same-type devices of the memory device.

9. A memory device of claim 8, further comprising a static random access memory device.

10. A memory device of claim 8, wherein said ring inverters comprising n-channel field effect transistors.

11. A memory device of claim 8, wherein said ring inverters comprising p-channel field effect transistors.

12. A memory device of claim 8 further comprising at least two feedback inverters;
    wherein said ring inverters divided into at least two groups of ring inverters, each said feedback inverter coupled to associated said group of ring inverters.

13. A memory device of claim 12 wherein said groups of ring inverters include an equal number of inverters.

14. A memory device of claim 12 wherein said at least two feedback inverters are located external of the memory device.

15. A method of measuring threshold voltage distribution in a memory device, the method comprising the steps of:

providing an array of ring oscillators in the memory device, each ring oscillator including a plurality of ring inverters coupled in series;

wherein said plurality of ring inverters includes existing same type devices of the memory device.

16. A method of claim 15 further comprising the steps of:

grouping said plurality of ring inverters into at least two groups;

providing at least two feedback inverters for the groups of ring inverters; and placing the at least two feedback inverters outside of the memory device.

17. A method of claim 16 further comprising the steps of:

enabling one or more ring oscillators of the array of ring oscillators;

toggling a first group of ring inverters of the array of ring oscillators;

toggling a first feedback inverter associated with the first group of ring inverters;

preconditioning the associated first group of ring inverters by the first feedback inverter;

toggling a subsequent group of ring inverters of the array of ring oscillators;

toggling an associated feedback inverters associated with the subsequent group of ring inverters;

preconditioning the associated subsequent group of ring inverters by the associated feedback inverter; and repeating the toggling and preconditioning processes until all groups of ring inverters and all feedback inverters have been toggled and preconditioned.

18. A method of claim 17 further comprising the steps of:

sending a plurality of ring oscillator output signals to an output circuit;

storing the plurality of ring oscillator output signals in the output circuit; and measuring an output frequency variation and frequency distribution of the plurality of ring oscillator output signals.

19. A method of claim 18 further comprising the step of determining the physical location of each ring inverter of the array of ring oscillators.

* * * * *